United States Patent [19]
Konishi et al.

[11] Patent Number: 5,592,407
[45] Date of Patent: Jan. 7, 1997

[54] ASSOCIATIVE MEMORY

[75] Inventors: Masahiro Konishi; Hiroshi Sasama; Masato Yoneda, all of Chiba, Japan

[73] Assignee: Kawasaki Steel Corporation, Kobe, Japan

[21] Appl. No.: 393,072

[22] Filed: Feb. 23, 1995

[30] Foreign Application Priority Data

Feb. 25, 1994 [JP] Japan .................................. 6-028130

[51] Int. Cl.$^6$ .................................................. G11C 15/00
[52] U.S. Cl. .................. 365/49; 365/230.03; 365/189.07
[58] Field of Search ................................... 365/49, 230.03, 365/189.07, 230.06

[56] References Cited

U.S. PATENT DOCUMENTS 4,945,512  7/1990  DeKarske et al. ..................... 365/49
5,034,919  7/1991  Sasai et al. ........................... 365/49
5,388,066  2/1995  Hamamoto et al. .................. 365/49

Primary Examiner—David C. Nelms
Assistant Examiner—Huan Hoang
Attorney, Agent, or Firm—Oliff & Berridge

[57] ABSTRACT

In an associative memory comprising a function to extend data width, for which match retrieval is to be conducted, up to a plurality of words, that is, a function to detect total match data when match is respectively detected for a plurality of continuous retrievals, power consumption can be reduced by making active only the necessary areas under the condition that the whole circuit is no longer required to be made active through execution of the current retrieval only to the blocks for which match is detected in the preceding retrieval during a plurality of continuous retrieving operations and/or its adjacent blocks.

9 Claims, 11 Drawing Sheets

FIG. 3

| ATTRIBUTE / GROUP NUMBER | I | II | III | IV |
|---|---|---|---|---|
| 1 | A | B | C | D |
| 2 | C | F | G | H |
| 3 | J | K | L | M |
| 4 | C | A | B | D |
| ⋮ | ⋮ | ⋮ | ⋮ | ⋮ |

ASSOCIATIVE MEMORY

BACKGROUND OF THE INVENTION

1. Field of the Invention

The present invention relates to an associative memory comprising a function to extend a width of data to be retrieved for match detection to a plurality of words, that is, a function to detect an integrated match condition in such a case that the match conditions are respectively detected during continual retrievals for several times.

2. Description of the Prior Art

An associative memory (Content Addressable Memory) which stores each digital data in each one of a plurality of arranged memory words and receives, as an input, a retrieval data in order to retrieve memory words which have stored digital data having bit patterns matched with the entire part of the inputted retrieval data or a predetermined part of the bit pattern has been proposed.

FIG. 1 is a block diagram of the circuit illustrating an example of the associative memory.

This associative memory 10 is provided with many memory words 11_1, 11_2, ... 11_n which are composed of memory cells of m bits which are arranged each other in the lateral direction of the figure to form one word. Moreover, this associative memory 10 is provided with a retrieval data register 12 to which a retrieval data of one word is inputted and latched. Thereby, matching or mismatching between the entire part of the retrieval data latched in the retrieval data register 12 or a predetermined part of the bit pattern and the bit pattern corresponding to such bit pattern among the storage data stored in the memory words 11_1, 11_2, ... 11_n is detected to output a coincident signal of logic "1" (assumed as 5 V, in this case) to the match lines 14_1, 14_2, ..., 14_n corresponding to the memory words 11_1, 11_2, ... 11_n of which bit patterns are matched among the match lines 14_1, 14_2, ..., 14_n provided corresponding to the respective memory words 11_1, 11_2, ... 11_n. The other match lines 14_1, 14_2, ..., 14_n are maintained at the logic "0" (assumed as 0 V, in this case).

The signals outputted to these match lines 14_1, 14_2, ..., 14_n are stored in each flag register 15_1, 15_2, ..., 15_n. Here, it is assumed, as an example, as illustrated in the figure, that "0", "1", "1", "0", ..., "0", "0" are respectively stored in each flag register 15_1, 15_2, ..., 15_n. The signals stored in these flag registers 15_1, 15_2, ..., 15_n are then inputted to a priority encoder 16. To the priority encoder 16, an encode pulse EP is inputted. For each input of the encode pulse EP, an address signal AD corresponding to a flag register having higher priority among the flag registers (two flag registers of 15_2 and 15_3, in this case) in which the logic "1" is stored is sequentially outputted in accordance with the predetermined priority. Here, a younger subscript means a higher priority. Therefore, when only one encode pulse EP is inputted, a memory address corresponding to the flag register 15_2 is outputted. An address signal AD outputted from the priority encoder 16 is then inputted as required to an address decoder 17. The address decoder 17 decodes this input address signal AD and outputs an access signal (a signal of logic "1", in this case) to the desired one word line (word line 18_2, in this case) corresponding to the inputted address signal AD among the word lines 18_1, 18_2, ..., 18_n provided respectively corresponding to each memory word 11_1, 11_2, ..., 11_n. Thereby, the storage data stored in the memory word 11_2 corresponding to the word line 18_2 to which the access signal is outputted is read by an output register 19.

Next, when another encode pulse EP is also inputted, an address of the memory word 11_3 corresponding to the flag register 15_3 can, in turn, be obtained.

As explained above, an associative memory 10 is structured to retrieve the data stored in many memory words 11_1, 11_2, ..., 11_n using whole part or predetermined part of the retrieval data in order to obtain the address of memory word having the coincident storage data and to read the data as a whole stored in such memory word as required.

For the associative memory having the basic structure as described above, the technology for expanding data width as the match retrieval object up to two or more words has been proposed.

FIG. 2 is a block diagram illustrating an example of the associative memory having a data width expanding function. The composing elements corresponding to that of the associative memory illustrated in FIG. 1 are denoted by the reference numerals like those in FIG. 1 and explanation about these elements is not repeated here.

Match lines 14_1, 14_2, ... expanding from the memory words 11_1, 11_2, ... are respectively connected to one input terminals of AND gates 20_1, 20_2, ... Moreover, output terminals of OR gates 21_2, 21_3, ... are connected to the other input terminals of the AND gates 20_1, 20_2, ... and input terminals of the OR gates 21_2, 21_3, ... are connected to a first retrieval control line 22. However, the OR gate corresponding to the upper most AND gate 20_1 of the figure is omitted and the first retrieval control line 22 is connected in direct to the input terminal of such AND gate 20_1.

Output terminals of the AND gates 20_1, 20_2, ... are connected to data input terminals of first flag registers 23_1, 23_2, ..., while output terminals of the first flag registers 23_1, 23_2, ... are connected to input terminals of second flag registers 24_1, 24_2, ... Output terminals of the second flag registers 24_1, 24_2, ... are connected to the priority encoder 16 illustrated in FIG. 1 (not illustrated in FIG. 2) and also connected to the input terminals of the OR gates 21_2, 21_3, ... corresponding to adjacent memory words illustrated in the lower part of FIG. 2.

Each pair among the first and second flag registers 23_1, 24_1 ... ; 23_2, 24_2, ... corresponding with each other corresponds to the flag registers 15_1, 15_2, ... shown in FIG. 1.

A match result latch signal S1 to be outputted to a match result latch control line 25 is inputted to both of the first flag registers 23_1, 23_2, ... and the second flag registers 24_1, 24_2, ... This match result latch signal S1 latches an input data inputted from each of the data input terminal. More specifically, an input data at the rise timing "a" of the match result latch signal S1 is latched in the first flag registers 23_1, 23_2, ..., while an input data at the fall timing "b" of the match result latch signal S1 is latched in the second flag registers 24_1, 24_2, ...

In the associative memory configured as explained above, match is retrieved as explained hereunder. Here, as illustrated in the figure, the data A, B, C, D, C, F, ... are assumed to be stored in the memory words 11_1, 11_2, 11_3, 11_4, 11_5, 11_6, ..., respectively.

Here, on the occasion of individually retrieving each stored data, a first retrieval timing signal S2 is outputted to the first retrieval control line 22 at the time of inputting the retrieval data REF_DATA for the purpose of retrieval operation. When the data "B" is assumed to be inputted as the retrieval data REF_DATA, a match signal of logic "1" is outputted to the match line 14_2 corresponding to the memory word 11_2 in which the data "B" is stored and is then outputted to the AND gate 20_2. Simultaneously, the first retrieval timing signal S2 is also inputted to the AND gate 20_2 via the OR gate 21_2, causing the AND gate 20_2 to output a signal of logic "1". In this case, since a signal of logic "0" is outputted to the other match lines 14_1; 14_3, 14_4, ..., the corresponding other AND gates 20_1; 20_3, 20_4, ... output a signal of logic "0".

The signal of logic "1" outputted from the AND gate 20_2 is latched in the first flag register 23_2 at the rise timing "a" of the match result latch signal S1 outputted to the match result latch control line 25 and is also latched in the second flag register 24_2 at the subsequent fall timing "b" of the match result latch signal S1.

Moreover, a signal of logic "0" is latched in the other first flag registers 23_1; 23_3, 23_4 ... and the other second flag registers 24_1; 24_3, 24_4 ... at each timing where a signal of logic "1" is latched in the first flag register 23_2 and the second flag register 24_2.

The signals of logic "0", "1", "0", ... latched in the second flag registers 24_1, 24_2, 24_3, ... are inputted to the priority encoder 16 illustrated in FIG. 1 as described above and thereby the address signal AD of the memory word 11_2 can be obtained.

Next, the retrieval for data of the extended width will then be explained. Here, the retrieval operation for data of two words composed of data "B" and data "C" which are extended to two words will be explained.

In this case, retrieval is performed first for the data "B" like the case explained above. Thereby, a signal of logic "1" is latched in the first and second flag registers 23_2, 24_2 corresponding to the memory word 11_2. Next, the retrieval is performed by inputting the data "C" as the retrieval data REF_DATA. In this case, the first retrieval timing signal S2 is not outputted to the first retrieval control line 22, maintaining this line in the state of logic "0". When the retrieval is performed by inputting the data "C" as the retrieval data REF_DATA, a match signal of logic "1" is outputted to the match lines 14_3, 14_5 corresponding respectively to a couple of memory words 11_3, 11_5 illustrated in the figure. However, since the signal of logic "1" latched in the second flag register 24_2 is inputted to the OR gate 21_3, the match signal of the match line 14_3 passes the AND gate 20_3 and the signal of logic "1" indicating the match condition is latched in the first and second flag registers 23_3, 24_3. On the other hand, since a signal of logic "0" latched in the second flag register 24_4 is inputted to the OR gate 21_5, a match signal of the match line 14_5 is cut off with the AND gate 20_5 and a signal of logic "0" indicating mismatch is latched in the first and second flag registers 23_5, 24_5. As described, match of two words data consisting of a pair of data "B" and data "C" can be detected. Coincidence of data of three or more words can also be detected in the same manner.

The associative memory illustrated in FIG. 2 is provided with a data width expanding function, but the data to be extended up to two or three words, etc. must be stored in the predetermined sequence in the adjacent memory words. Therefore, if a plurality of data to be retrieved are stored in the memory words separated from each other or if stored in the inverse sequence, that is, stored in the sequence of data "C" and data "B", detection of match of a plurality of combined data is no longer possible.

Example of a data format which requires the retrieval described above is illustrated in FIG. 3. FIG. 3 illustrates a data format wherein four data sets given respectively the attributes I, II, III, IV form one data group. As an example, in view of making obvious the concept of the data group and attributes, each data group of each group number 1, 2, 3, 4, ... indicates the data belonging to an individual, while the attribute I indicates a name of a person and II, date of birth, and III, address . . .

Here, an example of retrieving data group of the group number 1, for example, while retrieving the data group consisting of a plurality of data given the attributes I, II, III, IV stored in the associative memory, will be explained. In this case, it is necessary that not only the remaining data "C", "D" of the match data group are read by sequentially retrieving the data "A" and data "B", but also the remaining data "B", "C" are read by retrieving the data "A" and "D" and moreover the data "A" is retrieved after retrieving the data "B".

However, the retrieval explained above is impossible for the aforementioned associative memory (refer to FIG. 2) provided with the word width expanding function. Moreover, in the associative memory described above, when the data "A" and data "B" are retrieved, it is impossible to discriminate a pair of data "A" having the attribute I and the data "B" having the attribute II in the column of the group number 1 illustrated in FIG. 3 from a pair of data "A" having the attribute II and the data "B" having the attribute III in the column of the group number 4. For instance, when it is required, on the basis of the attribute I indicating "name" and attribute II indicating "date of birth" to know the attributes III and IV of particular persons whose attribute I and the attribute II are matched, noise other than the necessary information such as detection of match of a pair of the attributes II and III may be mixed.

An associative memory which has solved the problem explained above has been proposed by the same applicant of the present invention (refer to Japanese Patent Application No. HEI 5-248121). This patent is not yet published as the laid-open patent but an associative memory incorporated to this application will be explained as the related art.

FIG. 4 is a block diagram illustrating an example of the associative memory incorporated to above patent application. The composing elements same as those of the associative memory illustrated in FIG. 2 are designated by the reference numerals like those given in FIG. 2 and only different points will be explained.

Each memory words 11_1, 11_2, ... is composed of an attribute storing part 11_1_1, 11_2_1, ... for storing attributes and a data storing part 11_1_2, 11_2_2, ... for storing data to respectively store data consisting of a pair of attribute and data corresponding with each other. Here, as illustrated in the figure, data "A" of the attribute I; data "B" of the attribute II; data "C" of the attribute III and data "D" of the attribute IV belonging to the group number 1 illustrated in FIG. 3 are respectively stored in the memory words 11_1, 11_2, 11_3 and 11_4. Moreover, data "C" of the attribute I; data "F" of the attribute II, ... belonging to the group number 2 illustrated in FIG. 3 are stored respectively in the memory words 11_5, 11_6, ... For the retrieval operation, the retrieval data REF_DATA consisting of a pair of attribute and data is inputted.

The memory words 11_1, 11_2 are provided with match lines 14_1, 14_2, ... to which a match signal is outputted when the storage data (both attribute and data) stored in the memory word is matched with the input retrieval data (both attribute and data) and attribute match lines 30_1, 30_2, . . . to which only attribute match/mismatch signal is outputted. Match of only attribute and match of both attribute and data can be detected with the circuit having the similar structure to the match detection circuit of the prior art. Since the match detection circuit of the prior art is obvious for those skilled in the art of the associative memory, it is neither illustrated nor explained here.

Corresponding to the memory words 11_1, 11_2, third flag registers 31_1, 31_2, . . . are prepared and the attribute match lines 30_1, 30_2, . . . are extended to data input terminals of the corresponding third flag registers 31_1, 31_2, . . . Moreover, this associative memory is provided with data lines 32_1, 32_2, . . . one by one respectively for a memory word group consisting of a plurality of memory words to which data belonging to each data group illustrated in FIG. 3 is stored and also provided with first switches 33_1, 33_2, . . . between the data lines 32_1, 32_2, . . . and the output terminals of second flag registers 24_1, 24_2, . . . These first switches 33_1, 33_2, . . . are practically formed of transistors, etc. The other switches explained later are also formed in the same manner. The first switches 33_1, 33_2, . . . are switched on when a signal of logic "1" is latched in the corresponding third flag registers 31_1, 31_2, . . . and are cut off when a signal of logic "0" is latched therein. The third flag registers 31_1, 31_2, . . . latch the signals of the corresponding attribute match lines 30_1, 30_2, . . . at the fall timing "b" of the match result latch signal S1 outputted to the match result latch control line 25.

In addition, second switches 34_1, 34_2, . . . are also prepared between the data lines 32_1, 32_2, . . . and the input terminals of the OR gates 21_1, 21_2, . . . and these second switches 34_1, 34_2, . . . are controlled by the signal from the corresponding attribute match lines 30_1, 30_2, . . . to be switched on when the signal is logic "1" indicating the match condition or to be cut off when the signal is logic "0" indicating mismatch condition. Different from the associative memory illustrated in FIG. 2, an OR gate 21_1 is also provided in the preceding stage of the AND gate 20_1 corresponding to the memory word 11_1 at the upper most stage of the figure in the associative memory illustrated in FIG. 4.

In the associative memory configured as explained above, retrieval of match is performed as explained hereunder.

Since individual data retrieval of one word and the first retrieval among the retrievals of a plurality of continuous words is performed in the same manner as the associative memory with the word expanding function of the prior art illustrated in FIG. 2, explanation about the first retrieval is omitted here. Here it is assumed that logic "1" is latched, during the first retrieval, in the first and second flag registers 23_2, 24_2 corresponding to the memory word 11_2 with the retrieval data REF_DATA consisting of the attribute II and data "B". In this case, a signal of logic "1" is outputted, upon matching of the attribute, to the attribute match line 30_2 corresponding to the memory word 11_2 and thereby a signal of logic "1" is also latched in the corresponding third flag register 31_2. Accordingly, the corresponding first switch 33_2 is switched on and a signal of logic "1" indicating match of both attribute and data stored in the corresponding second flag register 24_2 is outputted-to the data line 32_1. Simultaneously, the corresponding second switch 34_2 is also switched on, but it is useless operation in the first retrieval operation.

Next, it is assumed that the retrieval is performed by inputting the retrieval data REF_DATA consisting of the attribute IV and data "D". In this case, like the associative memory of FIG. 2, the first retrieval control line 22 is maintained at the logic "0". In this timing, upon reception of signal indicating match of attribute, a signal of logic "1" is outputted to the attribute match line 30_4 corresponding to the memory word 11_4 and thereby the corresponding second switch 34_4 is turned on, inputting a signal of logic "1" of the second flag register 24_2 corresponding to the memory word 11_2 being outputted to the data line 32_1 is then inputted to the AND gate 20_4 via the OR gate 21_4. Therefore, match of both attribute IV and data "D" is detected by the memory word 11_4 and a match signal of logic "1" is outputted to the match line 14_4. Then a signal of logic "1" is latched in the corresponding first and second flag registers 23_4, 24_4 with the match result latch signal S1 outputted to the match result latch control line 25. Also, in this case, a signal of logic "1" outputted to the attribute match line 30_4 is latched in the corresponding third flag register 31_4, the corresponding first switch 33_4 is turned on and a signal of logic "1" of the second flag register 24_4 is outputted to the data line 32_1. In this second retrieval, since logic "0" indicating mismatch of attribute is outputted to the attribute match line 30_2 corresponding to the memory word 11_2, "0" is stored in the corresponding third flag register 31_2 and the first switch 33_2 corresponding to the memory word 11_2 turns off.

Thereby, a signal of logic "1" of the second flag register 24_4 corresponding to the memory word 11_4 is inputted to the priority encoder 16 (refer to FIG. 1) and an address of the memory word 11_4 can be obtained. However, it is previously known that the attribute IV is stored in the memory word 11_4 and if it is requested to read data, for example, of the attribute III in the same group, an address of the memory word 11_3 is obtained by subtracting one from the address obtained and this address is then inputted to the address decoder 17 to read contents of the memory word 11_3.

Meanwhile, when retrieval is carried out with a retrieval data consisting, for example, of the attribute IV and data "B", in place of the retrieval data consisting of the attribute IV and data "D" as the second retrieval operation, the second switch 34_4 is switched on because of match of attribute and a signal of logic "1" outputted on the data line 32_1 is fetched for the memory word 11_4, but since data is different, the logic "0" indicating mismatch of data is outputted to the match line 14_4 and the logic "0" indicating mismatch is latched in the first and second flag registers 23_4 and 24_4. Moreover, attribute is mismatched for the memory word 11_2 for which the data "B" is matched and thereby both attribute and data are not matched.

As described, in the associative memory illustrated in FIG. 4, the retrieval may be performed in the same group even when it is conducted for the data stored in the memory words separated from each other or the data in the inverse sequence.

Here, the data lines 32_1, 32_2, . . . of the associative memory illustrated in FIG. 4 are fixed in the length thereof under the supposition that the number of data belonging to one group is predetermined, but when the data lines of the fixed length are provided, the maximum number of data belonging to one group must be estimated to provide the data lines corresponding to such maximum number of data. As a result, useless memory words may be generated in such a case that data group is formed with the number of data smaller than the maximum number of data. Therefore, it is preferable that the data lines are set in the variable length in accordance with the number of data belonging to one group.

FIG. 5 is a schematic view illustrating a system for realizing variable length data lines.

The data line 32 is extended over a plurality of memory words 11_1, 11_2, 11_3, ... and is provided with switches 40_1, 40_2, 40_3, ... connected in series corresponding respectively to the other memory words 11_2, 11_3, ... except for the upper most memory word 11_1. The switches 40_2, 40_3, 40_4, ... are arranged between the corresponding memory words 11_2, 11_3, 11_4, ... and the adjacent memory words 11_1, 11_2, 11_3, ... provided at just upper stage of the corresponding ones. The every other switches 40_2, 40_4, 40_6, ... among the switches 40_2, 40_3, 40_4, ... are switched on with the first switch control signal outputted to the first control line 41 and every fourth switches 40_3, 40_7, ... are switched on with the second switch control signal outputted to the second control line 42 and the every ninth switches 40_5, ... among the remaining switches are switched on with the third switch control signal outputted to the third control line 43.

When the number of data forming one data group is 2, every other switches 40_2, 40_4, 40_6, ... are switched on by outputting the first switch control signal to the first control line 41. Thereby, the data lines disconnected for every two memory words 11_1, 11_2; 11_3, 11_4; 11_5, 11_6; ... are formed. In addition, when the number of data forming one data group is 4, the first switch control signal is outputted to the first control line 41 and the second switch control signal is outputted to the second control line 42. Thereby, the data lines disconnected for every four memory words 11_1, 11_2, 11_3, 11_4; 11_5, 11_6, ... are formed. In the same manner, the number of data forming one data group is 8, the first and second switch control signals are outputted respectively to the first control line 41 and the second control line 42 and the third switch control signal is outputted to the third control line 43. Thereby, the data lines disconnected for every eight memory words 11_1, ... , 11_8; 11_9, ... are formed.

According to this system, when the number of data forming one data group is $2^n$, any vacant one is generated in the memory words, but such number is, for example, 3, 5, 9, etc., other than $2^n$, vacant memory words may be generated. When a structure is formed so that many switches 40_2, 40_3, ... can be switched on or off as desired in order to avoid generation of vacant memory words, the number of control lines increases and the control circuit for outputting switch control signals to these control lines may be complicated. Therefore, the system illustrated in FIG. 5 is not suitable for perfect control of the data line length.

FIG. 6 is a schematic diagram illustrating another system for realizing variable length data lines.

This system is similar to FIG. 5 in the points that the data line 32 is extended over many memory words and is provided with the switches 40_2, 40_3, 40_4, ... connected in series with each other corresponding respectively to the memory words other than the memory word at the upper most end. Each memory word is provided with each attribute storing part 11_1_1, 11_2_1, 11_3_1, ... to respectively store each attribute I, II, III, IV illustrated in the figure. This example is structured so that the corresponding switch is controlled for on or off state depending on that the attribute stored in the attribute storing part 11_1_1, 11_2_1, 11_3_1, ... is attribute I or other attributes II, III, IV, that is, the corresponding switch is maintained in the off state when the attribute is I or is switched on when the attribute is II, III or IV. This structure automatically enables formation of data lines disconnected for the right number of memory words by arranging the data of attribute I at the leading part of each data group without relation to the number of data forming one data group or even if data group of different number of data is mixed.

FIG. 7 is a circuit diagram illustrating an example of an attribute deciding circuit for deciding whether the attribute is I or not.

In this case, "000" is assigned for the attribute I and when the attribute stored in the attribute storing part 11_i_1 is I ("000"), "0" is outputted from the OR gate. Therefore, the switch formed of a transistor 40 is turned off and both data lines of the transistor 40' are electrically disconnected. When the attribute stored in the attribute storing part 11_i_1 is other than I, "1" is outputted from the OR gate, the transistor 40 is turned on, and the data lines in both sides of the transistor are connected.

As described, length of the data lines 32_1, 32_2, ... can be adjusted depending on the number of data forming one data group in the associative memory illustrated in FIG. 4. Here, it is of course possible to adjust the length of data lines by controlling the switches with the exclusive control lines, in place of utilizing attribute data.

An associative memory is accompanied by requirement for reduction of power consumption like the other ordinary RAM memory, etc. In an ordinary RAM memory, an address is inputted for making access to memory words of such address. Therefore, reduction of power consumption can be realized by dividing many memory words into many blocks and then making active, depending on the input address, only the block including the memory word designated by such input address.

However, an associative memory retrieves the memory words, by inputting a retrieval data, in which the data matching with the input retrieval data is stored. Therefore, if the memory words are divided into blocks, it is unknown in which memory word of which block match can be detected. Accordingly, all blocks must be made active and it is impossible to reduce power consumption only with dividing memory words into many blocks.

The Japanese Patent Application Laid-open No. HEI 3-212896 describes that an associative memory array is divided for every plural arrangements of one direction to form blocks, a block selecting means of selecting any one block is provided so that power consumption of the associative memory can be reduced by comparing only the block selected by this block selecting means with the retrieval data.

However, this technique described in the Japanese Patent Application Laid-open No. HEI 3-212896 has disadvantages that a memory block selecting information must be previously set at a part of the input address for the retrieval operation and moreover an extra hardware and processing time are required for attaining such requirement.

SUMMARY OF THE INVENTION

Considering the aforementioned background of the invention, it is therefore an object of the present invention to provide an associative memory which has realized reduction of power consumption by making active only the necessary portion under the condition that the circuit as a whole is not required to be made active.

An associative memory of the present invention in view of achieving the object described above is of the associative memory for retrieving storage data corresponding to an input retrieval data by previously storing many storage data and then inputting the retrieval data, characterized in comprising:

(1) a large number of memory words divided into a plurality of memory blocks to respectively include at least one memory word group consisting of a plurality of memory words storing each storage data;

(2) flag registers provided corresponding to a large number of memory words for storing match flags indicating that storage data corresponding to the input retrieval data is stored in such a case that it is detected at the time of retrieval operation that the data corresponding to the input retrieval data is stored in the corresponding memory words; and (3) bit line drive circuits for driving bit lines of a memory block for the current retrieval in accordance with the condition of the match flags stored in the flag registers at the time of the preceding retrieval operation.

The associative memory of the present invention realizes reduction of power consumption by making active a plurality of blocks as a whole for the first retrieval operation, as explained with reference to FIG. 4, in such a case as continuously retrieving the data of a plurality of words and then making active, for the second and subsequent retrieval operations, only the memory block including memory word for which match is detected and/or the other memory blocks having a possibility of storing remaining memory of the same memory word group (adjacent blocks, for example).

BRIEF DESCRIPTION OF THE DRAWINGS

The preferred embodiments will be described with reference to the drawings, wherein like elements have been denoted throughout the figures with like reference characters, and wherein:

FIG. 3 is a diagram illustrating an example of data format of a group structure;

DESCRIPTION OF THE PREFERRED EMBODIMENTS

In the following, embodiments of the present invention will be described in detail with reference to the drawings.

Figure 8:
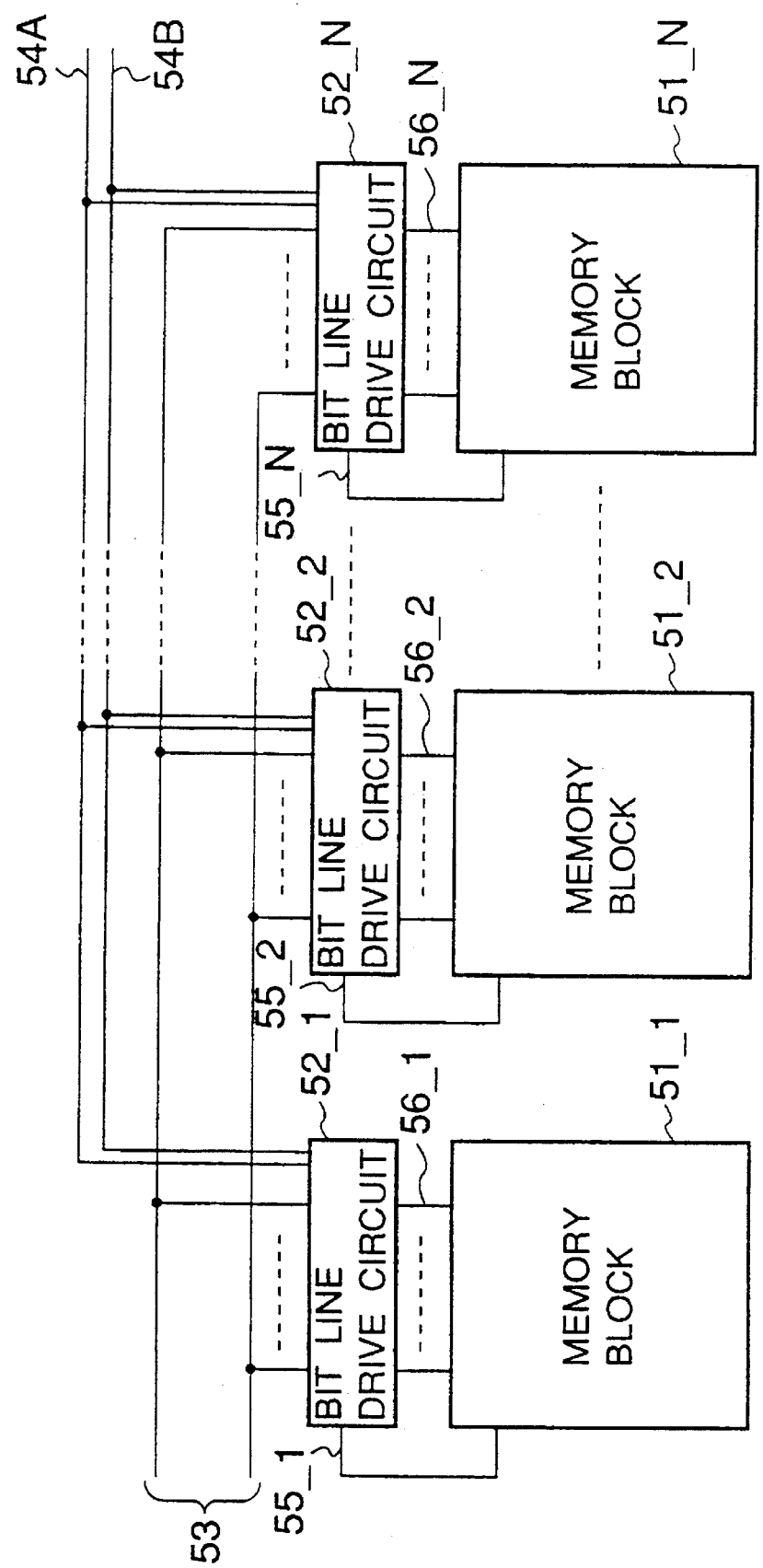
FIG. 8 is a block diagram of a first embodiment of an associative memory of the present invention.

FIG. 8 is a block diagram of a first embodiment of an associative memory of the present invention. In the associative memory, a large number of memory words are divided into a plurality of blocks as can be done in an ordinary large capacity memory, namely, divided into N memory blocks $51\_1, 51\_2, \ldots, 51\_N$ in this embodiment. Each memory block $51\_1, 51\_2, \ldots, 51\_N$ is formed of at least one memory block group consisting of a plurality of memory words which is a unit of retrieval for a plurality of words.

Each block $51\_1, 51\_2, \ldots, 51\_N$ is respectively provided with each bit line drive circuit $52\_1, 52\_2, \ldots, 52\_N$ which are connected with the retrieval data line 53, control lines 54A, 54B and each in-block match line $55\_1, 55\_2, \ldots, 55\_N$.

A retrieval data for writing or reading data to/from the memory or for executing the retrieval operation is inputted to the retrieval data line 53 (also called as bit line).

The above control line 54A is activated for the retrieval operation. Moreover the control line 54B is activated for the first retrieval data input of the retrieval operations for a plurality of words and invalidates the result of the retrieval operations up to the preceding retrieval.

The in-block match lines $55\_1, 55\_2, \ldots, 55\_N$ are activated when at least one or more matches are detected among a plurality of words included in each memory block.

The in-block match lines and a circuit for generating the same are provided in a common associative memory to make priority order control in a plurality of divided memory blocks. Therefore, they are not newly required hardware for realizing the present invention.

The bit line drive circuits $52\_1, 52\_2, \ldots, 52\_N$ are activated, when match is detected therein as a result of retrieval and thereby corresponding in-block match line is activated, depending on the signal conditions of the lines 53, 54A, 54B, $55\_1, 55\_2, \ldots, 55\_N$, to drive the bit lines (including bit bar lines) $56\_1, 56\_2, \ldots, 56\_N$. Thereby, only the corresponding memory block is activated and the retrieval operation is realized.

Figure 9:
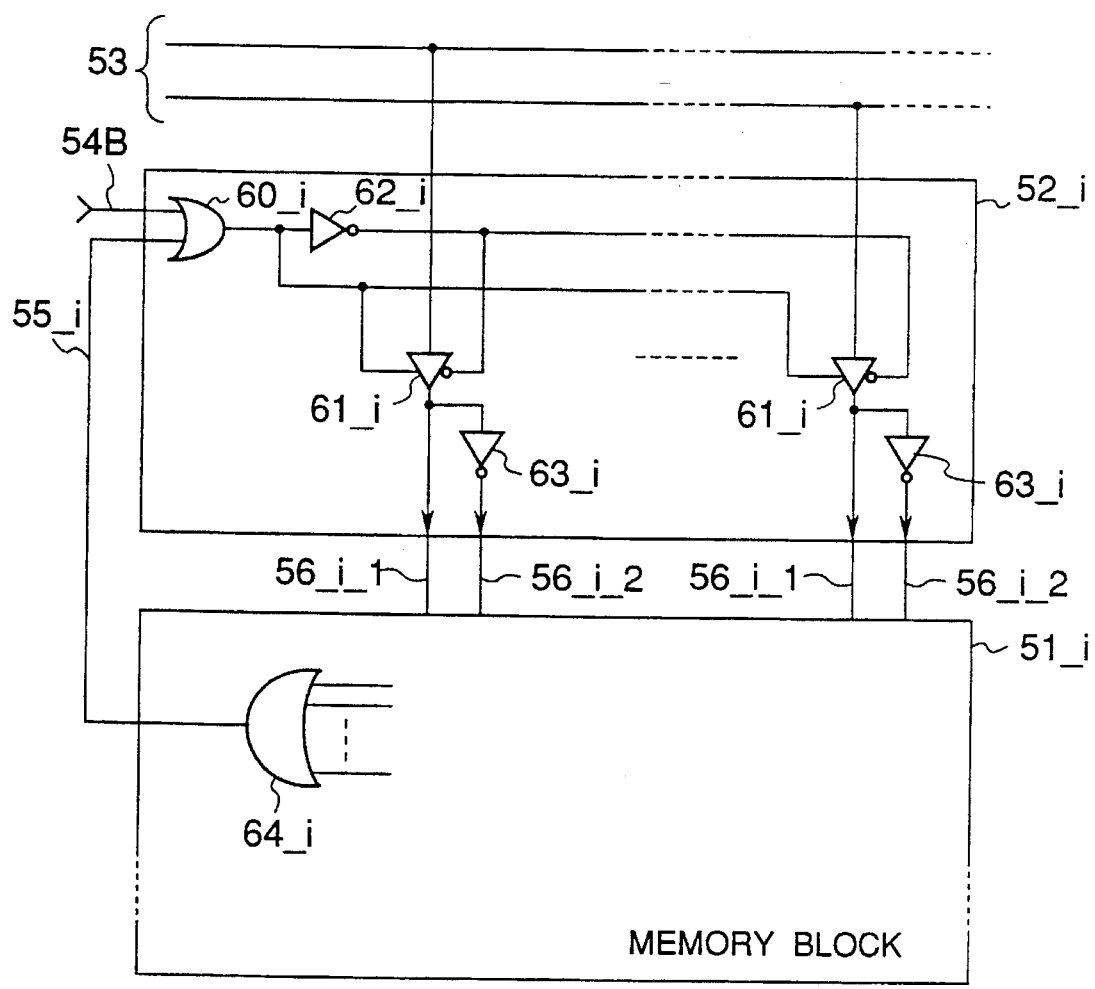
FIG. 9 is a circuit diagram of a bit line drive circuit employed in the first embodiment.

FIG. 9 is a circuit diagram illustrating the i-th bit line drive circuit in FIG. 8.

In FIG. 9, $60\_i$ denotes an OR gate for providing logical sum of the first retrieval control line 54B signal and in-block match line $55\_i$; $61\_i$, a transfer gate which is turned on and off with an output of the OR gate $60\_i$ to activate the bit line $56\_i\_1$ connected to the memory block $51\_i$; $62\_i$, an inverter for inverting an output of the OR gate $60\_i$; $63\_i$, an inverter for inverting an output of the transfer gate $61\_i$ to activate the bit bar line $56\_i\_2$ connected to the memory block $51\_i$.

On the occasion of the first retrieval operation, a control signal of logic "1" is impressed to the first retrieval control line 54B, such control signal is transmitted to the transfer gate $61\_i$ through the OR gate $60\_i$. Thereby, the transfer gate $61\_i$ turns on and the retrieval data inputted via the retrieval data line 53 is outputted to the bit line $56\_i\_1$ and bit bar line $56\_i\_2$. On the occasion of the first retrieval operation, retrieval is carried out for all memory blocks $51\_1, 51\_2, \ldots, 51\_N$ as described above.

Figure 1:
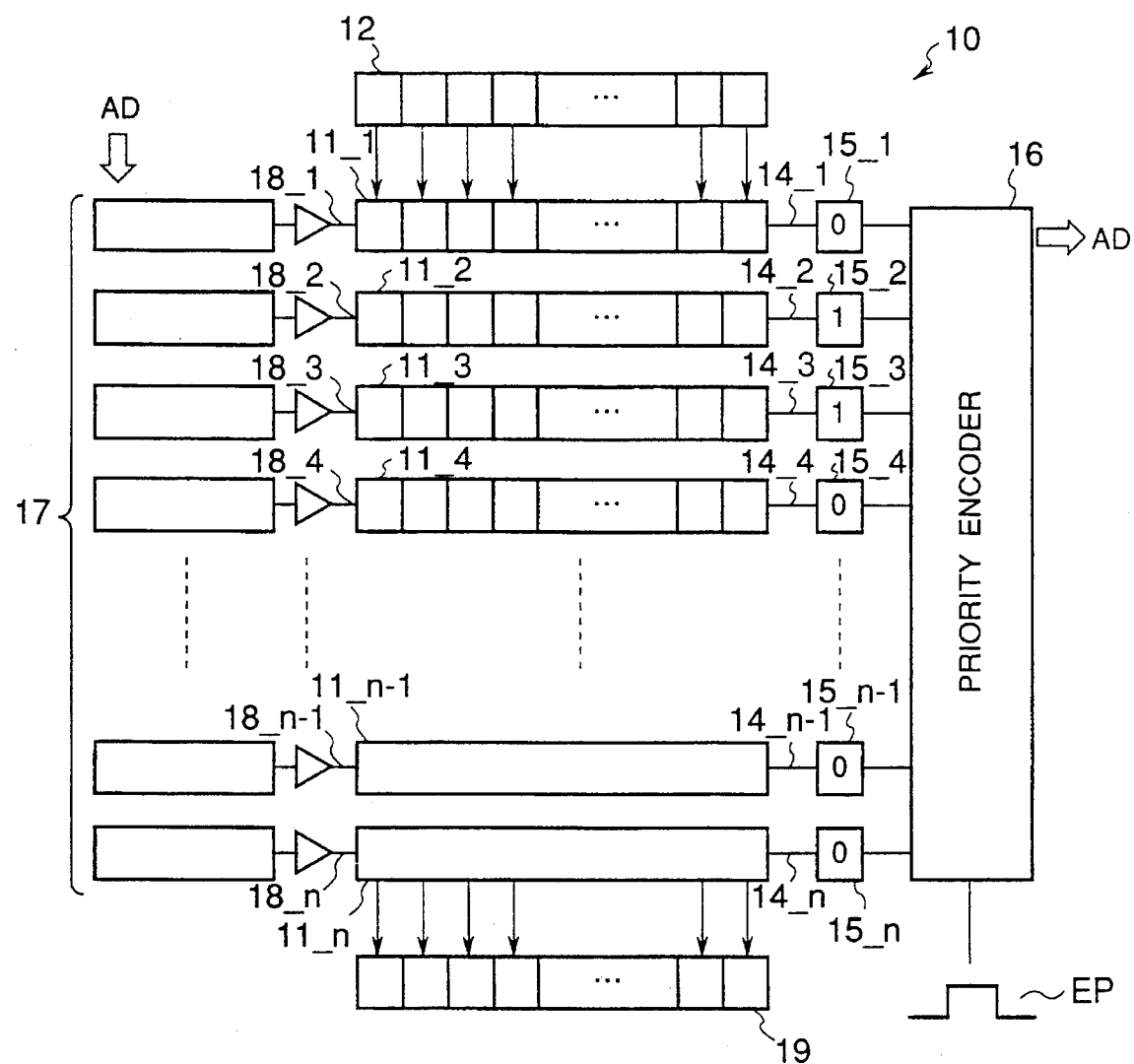
FIG. 1 is a block diagram of a circuit illustrating an example of the associative memory of the prior art.
Figure 2:
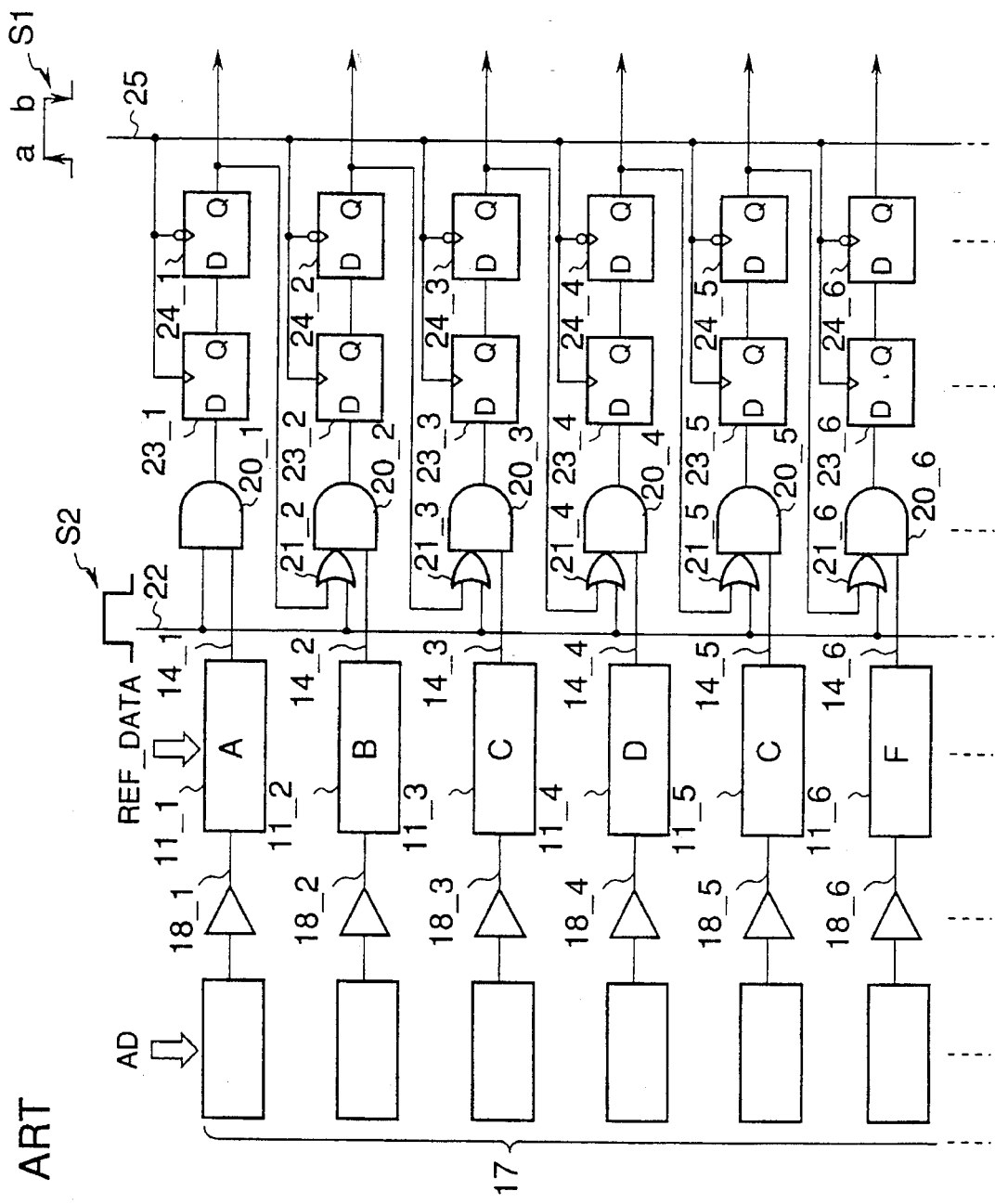
FIG. 2 is a block diagram illustrating the associative memory of the prior art provided with a data expanding function.
Figure 4:
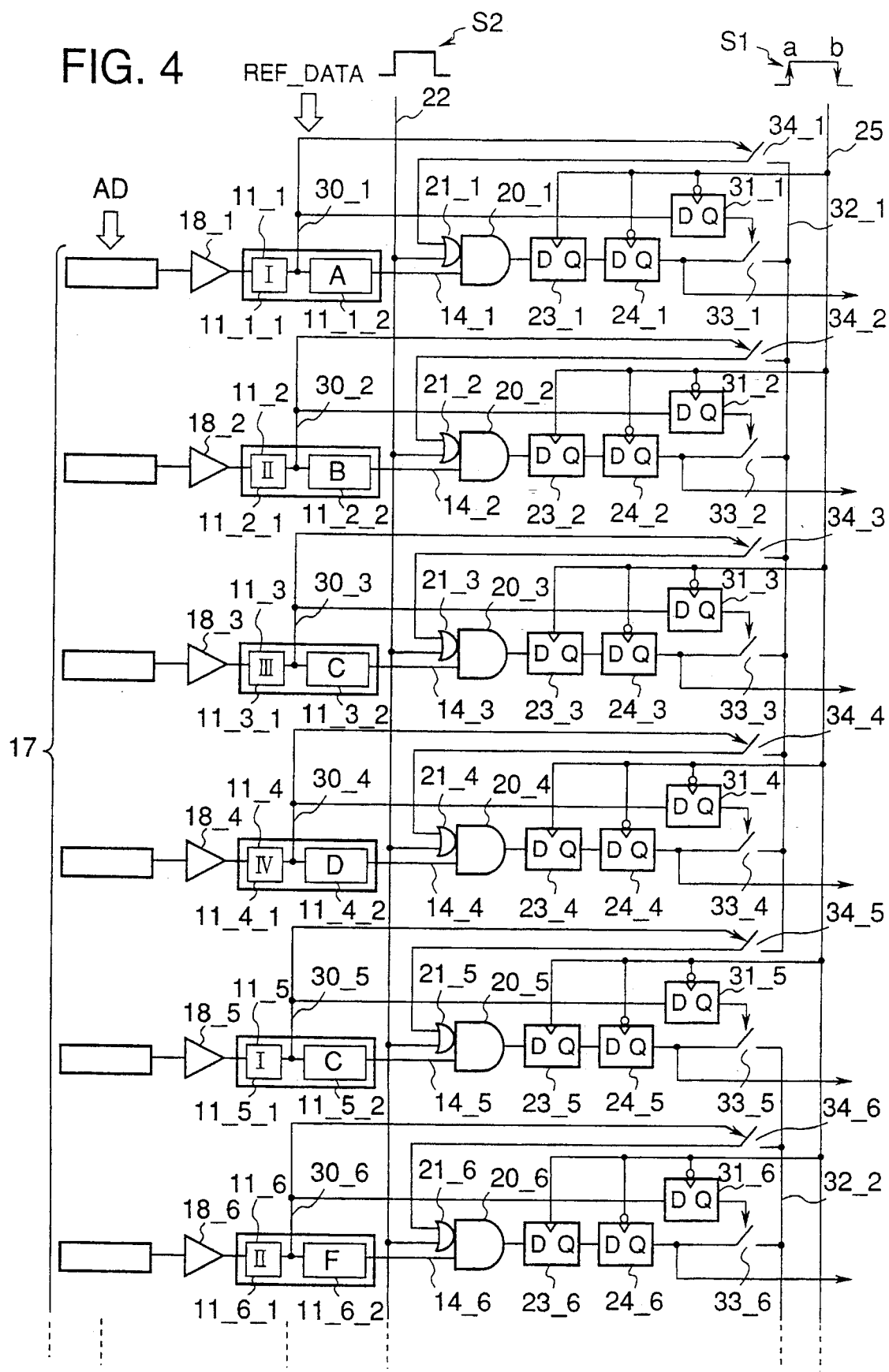
FIG. 4 is a block diagram illustrating a related example of an associative memory.
Figure 5:
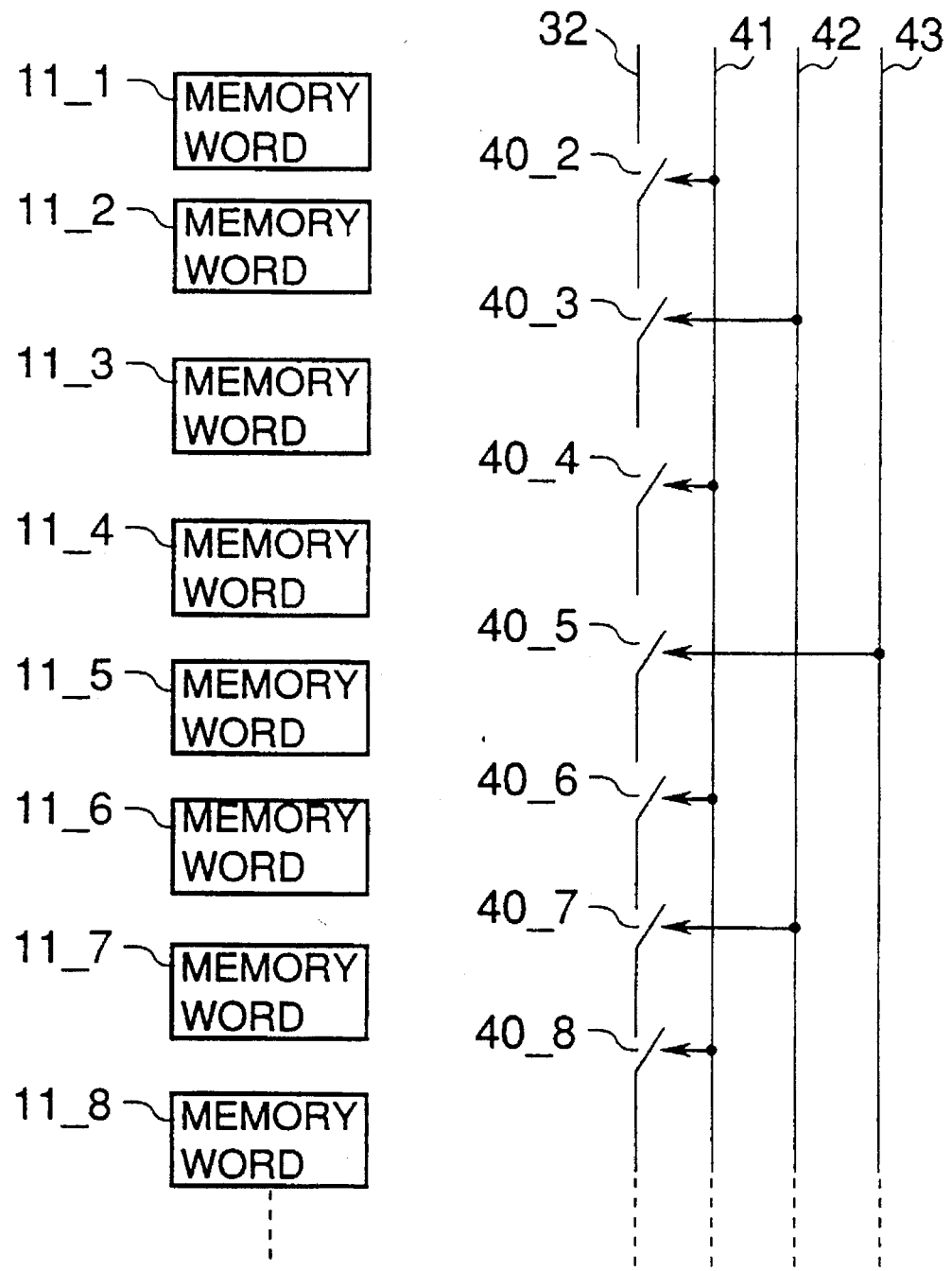
FIG. 5 is a schematic diagram illustrating a system for realizing variable length data lines.
Figure 6:
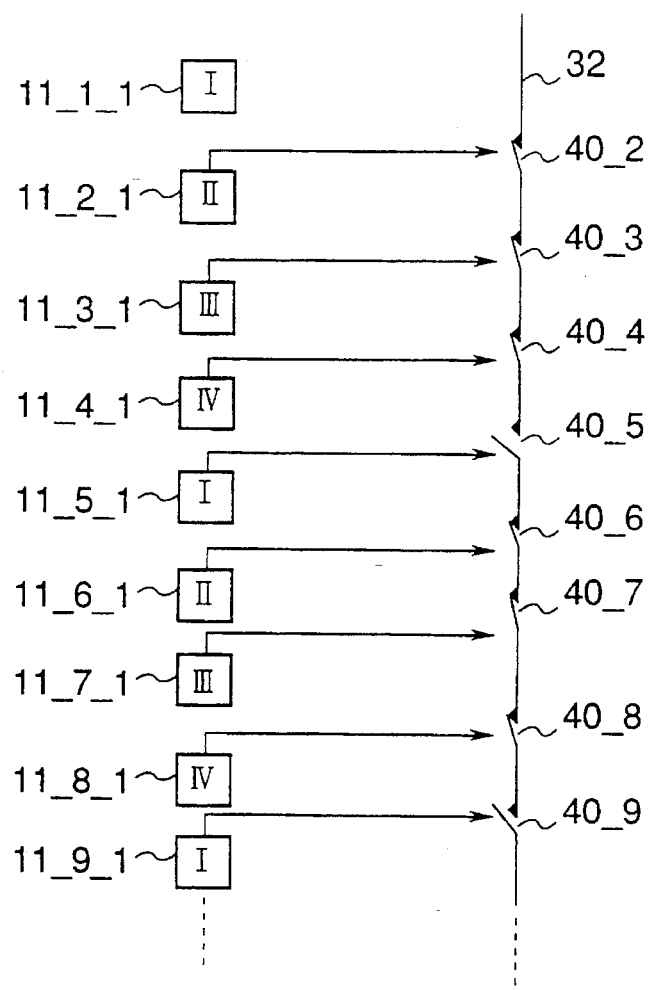
FIG. 6 is a schematic diagram illustrating another system for realizing variable length data lines.
Figure 7:
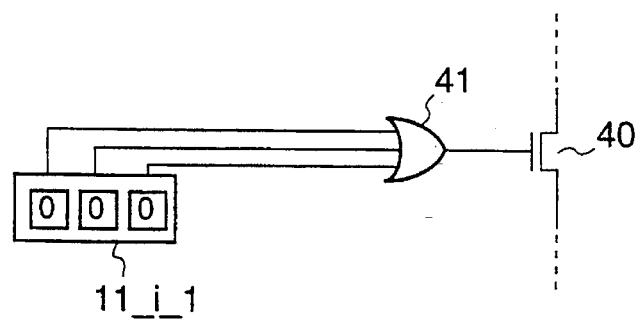
FIG. 7 is a circuit diagram illustrating an example of an attribute decision circuit.

When logic "1" is stored in any one of the flag registers (refer to second flag registers $24\_1, 24\_2, \ldots$ of FIG. 4) in the memory block $51\_i$, logic "1" is outputted to the in-block match line $55\_i$ from the OR gate $64\_i$ for executing logical sum operation of the storing conditions of the flag registers in the relevant block.

On the occasion of the second and subsequent retrieval operations, a control signal of logic "0" is impressed to the control line 54B. Therefore, only when match is detected in any memory word of the block 51_i at the time of preceding retrieval operation, the retrieval data inputted through the retrieval data line 53 is outputted, at the time of current retrieval operation, to the bit line 56_i_1 and bit bar line 56_i_2. When match is not detected in any memory word of the memory block 51_i at the time of preceding retrieval operation, since the in-block match line 55_i is maintained in the state of logic "0", an output of the OR gate 60_i is set to the logic "0", while the transfer gate 61_i is turned off. Thereby, the retrieval data inputted through the retrieval data line 53 at the time of current retrieval operation is not inputted to the bit line 56_i_1, bit bar line 56_i_2, controlling the power consumption by the charge and discharge of the bit line 56_i_1 and bit bar line 56_i_2.

As an example, retrieval for four continuous retrieval data is considered. When the first retrieval data is inputted, the control line 54B is activated and all bit lines (including the bit bar lines) are activated through the bit line drive circuits 52_1, 52_2, ..., 52_N. Therefore, all the N blocks 51_1, 51_2, ..., 51_N are activated.

When match is detected in p (p≦N; N is a total number of blocks) blocks at the time of first retrieval operation, the p in-block match lines are activated and the second retrieval operation is carried out only for p memory blocks. As a result, when match is detected in the q (q≦p) blocks, the q in-block match lines are then activated. Sequentially, match is detected in the r (r≦q) memory blocks for the third retrieval operation and in the s (s≦r) memory blocks for the fourth retrieval operation.

As explained above, the number of memory blocks to be activated is gradually reduced and the power consumption required can be reduced to $$(p/N) \times (q/N) \times (r/N) \times (s/N) \ll 1$$

against the power consumption of the circuit which does not use the bit line drive circuit and always executes the retrieval operations for all memory words.

In usual, p, q, r, s≪N and remarkable reduction of power consumption can be achieved for a plurality of continuous retrieval operations.

Next, the second embodiment of the present invention will be explained hereunder in detail.

Figure 10:
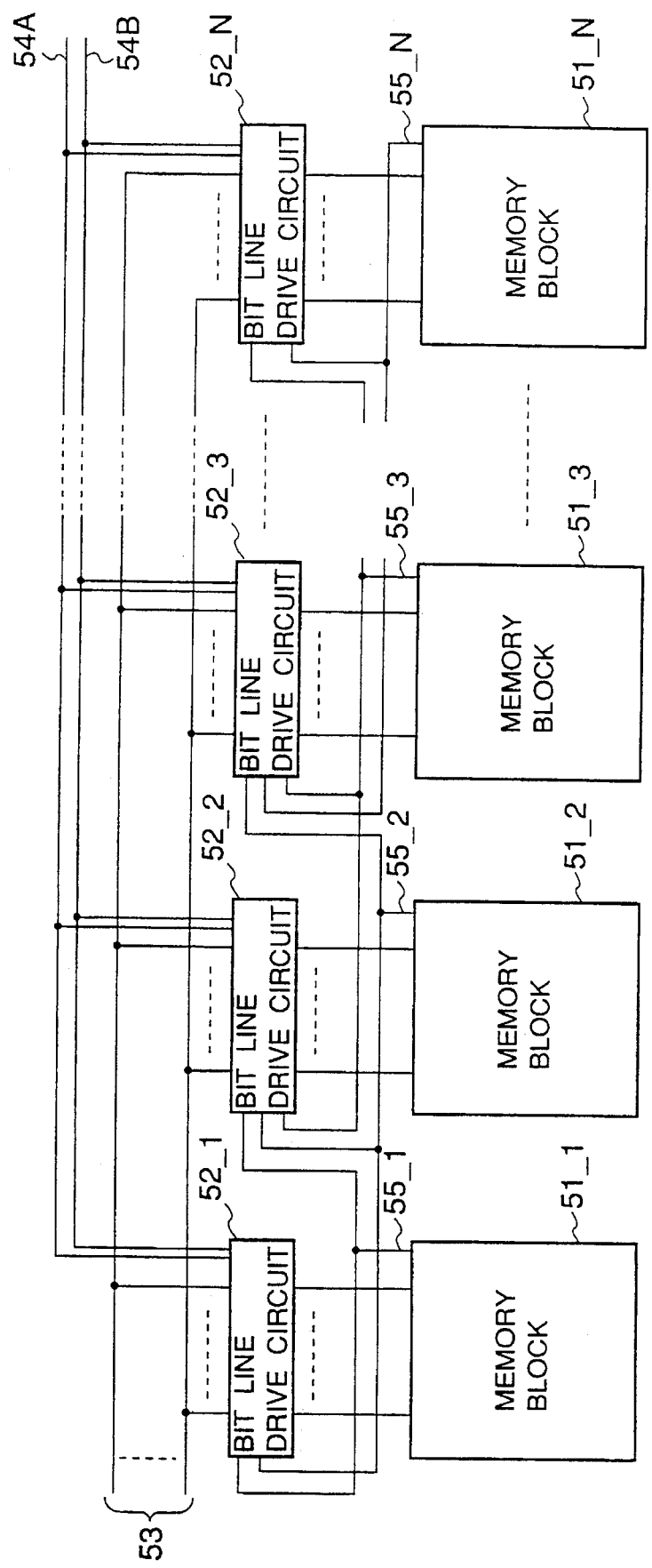
FIG. 10 is a block diagram of a second embodiment of the associative memory of the present invention.
Figure 11:
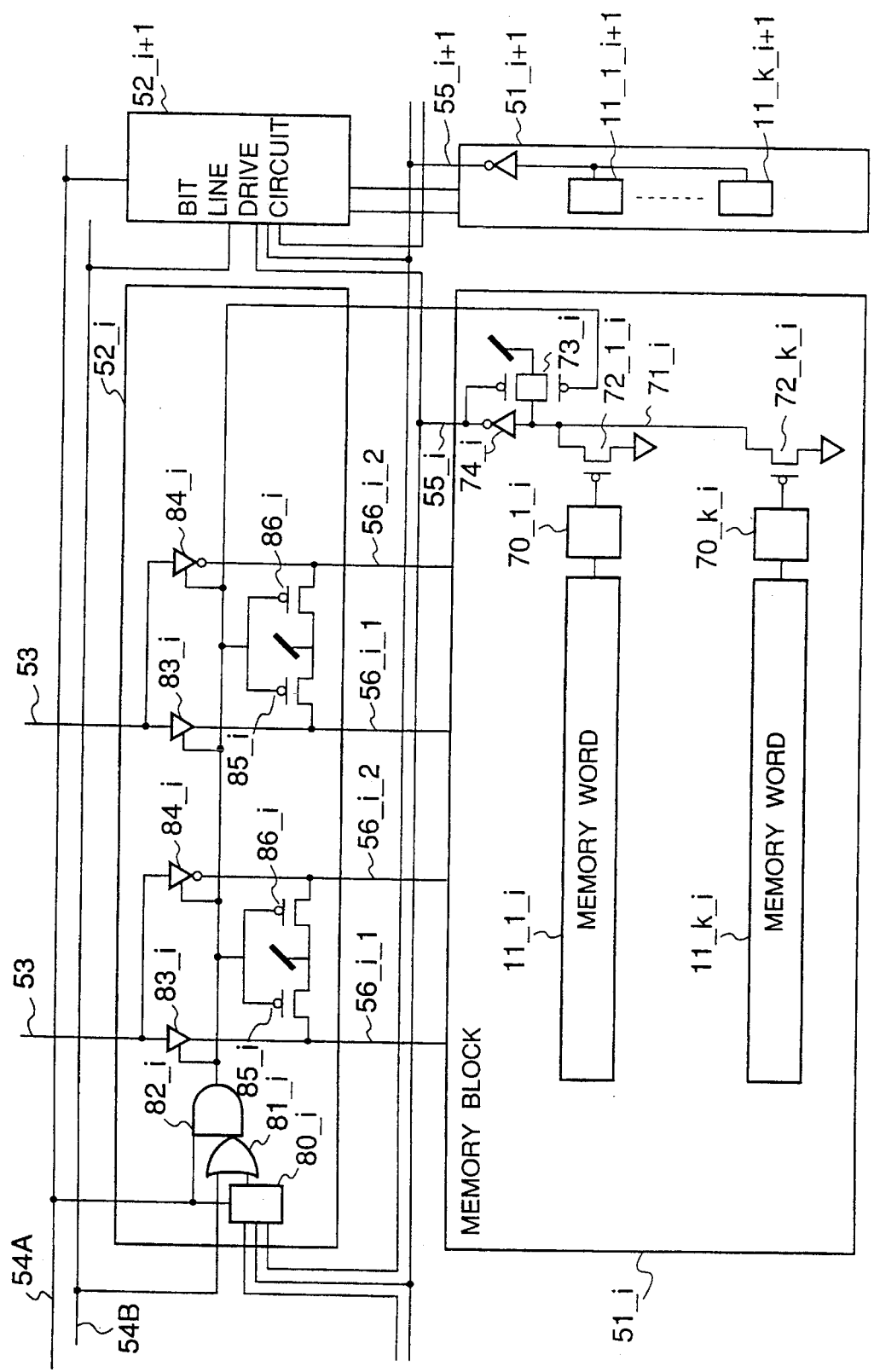
FIG. 11 is a circuit diagram of a bit line drive circuit employed in the second embodiment.

FIG. 10 illustrates an entire structure of the second embodiment and FIG. 11 illustrates a detail structure of the same embodiment.

In the memory block 51_i of FIG. 11, 70_1_i to 70_k_i denote registers for storing match flags outputted from the memory words 11_1_i to 11_k_i; 71_i, a wired NOR including a wire grounded by switch elements 72_1_i to 72_k_i when the match flag is stored in corresponding one of the match flag storing registers 70_1_i to 70_k_i; 73_i, a switch element for precharging the wire by connecting it to a power supply and maintaining such condition; 74_i, an inverter for inverting an output of the wired NOR 71_i to obtain an in-block match signal (hit flag). Combination of the wired NOR 71_i and the inverter 74_i correspond to the OR gate 64_i of FIG. 9.

In the bit line drive circuit 52_i of FIG. 11, 80_i denotes a register for storing in-block hit flag inputted from the corresponding memory block 51_i and preceding and subsequent memory blocks 51_i−1 (not illustrated) and 51_i+1; 81_i, OR gate (corresponding to the OR gate 60_i in FIG. 9) for outputting logical sum of an output of the in-block hit flag storing register 80_i and an output of the first retrieval control line 54B; 82_i, AND gate (not illustrated in FIG. 9) for outputting logical product of an output of the OR gate 81_i and an output of the retrieval control line 54A (not illustrated in FIG. 9); 83_i, a transfer gate (corresponding to the transfer gate 61_i of FIG. 9) which is controlled for on and off states with an output of the AND gate 82_i; 84_i, a transfer gate with inverter (corresponding to combination of the transfer gate 61_i and the inverter 63_i of FIG. 9) which is controlled for on and off states with an output of the AND gate 82_i for activating the bit bar line 56_i_2; 85_i, 86_i, switch elements for respectively precharging the bit lines 56_i_1, 56_i_2.

When retrieval data of the same word group are stored over two memory blocks, if match is not detected in a certain block by the preceding retrieval operation, such block must be activated in the current retrieval operation. Therefore, the in-block match lines of both sides are inputted to a certain bit line drive circuit in this second embodiment.

It is also assumable that retrieval data of the same word group are stored over three blocks, but it is generally difficult to think that a certain related data is inputted for three or more blocks and it is usually enough to consider the data inputted for two blocks. If it is possible to assume that data is inputted to three blocks, it is enough to input the in-block match lines of not only both sides but also further adjacent blocks to the bit line drive circuits of the relevant block.

Effect of the second embodiment will be explained along with the retrieval operation.

As an example, three time retrieval operation for three continuous words is considered. For the first retrieval, the first retrieval control line 54B is activated, the retrieval data is inputted to the bit lines and the control line 54A is activated for initiating the retrieval operation.

Since the control line 54B is activated, all memory blocks (N blocks) are activated in the first retrieval and retrieval is performed for all memory regions.

When the control line 54A is activated, precharge of the bit line drive circuit and memory block is cancelled and the retrieval data is inputted to the memory to detect the result of retrieval operation.

This result is stored in the match flag storing register 70_i within the memory block and is also stored in the in-block hit flag storing register 80_i of the bit line drive circuit 52_i. When match is detected in p (p≦N; N is a total number of blocks) blocks in total, the 3p (3p≦N) blocks are activated in the worst case where all match detected blocks are not end portions. As a result, when match is detected in q blocks, the 3q memory blocks are activated in the worst case in the third retrieval operation. As a result, the power consumption reduced to $$(N/N) \times (3p/N) \times (3q/N) \ll 1$$

for that of the circuit not employing the structure of this embodiment of the present invention.

Usually, p, q≪N, and remarkable reduction of power consumption can be realized.

Figure 12:
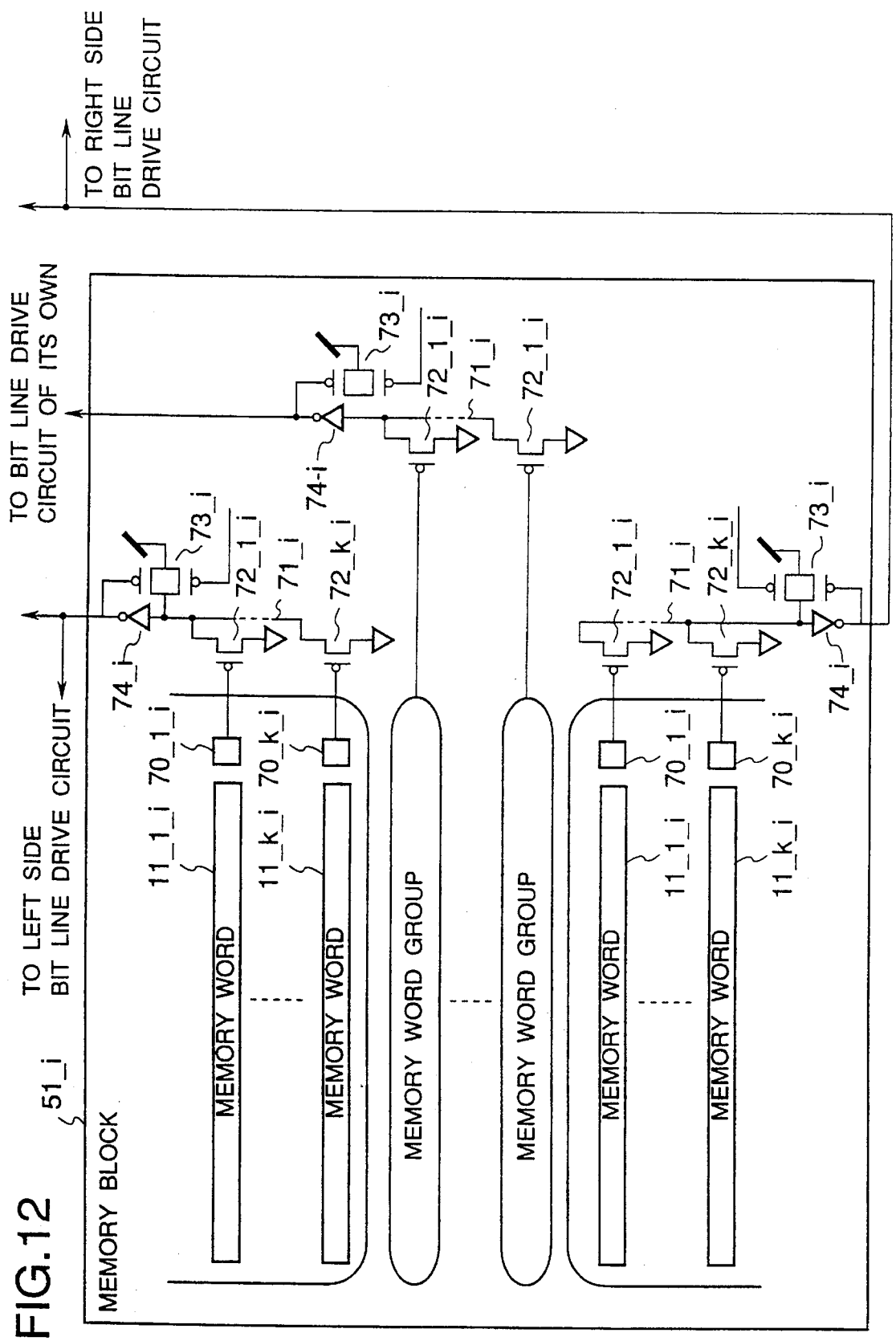
FIG. 12 is a block diagram of a third embodiment of an associative memory of the present invention.

FIG. 12 illustrates a third embodiment of the present invention. This embodiment is effective when the number of words of data over memory blocks can be assumed previously.

Namely, the memory blocks of both sides must be activated only when the words being matched constitute the same word group with the words of the adjacent blocks. When a word group exists in the single block, it is enough to activate only own memory block when match is generated.

Therefore, the in-block match signal is outputted by sorting it, in the memory blocks, into three signals including the signal only to own bit line drive circuit, the signal to own and left side bit line drive circuits and the signal to own and right side bit line drive circuit.

By introducing such constitution, probability of block to be activated is lowered to the second embodiment and thereby power consumption can be reduced remarkably.

In the above embodiments, all memory blocks are activated at the first retrieval. However, number of the memory blocks activated at the first retrieval may be restricted as in Japanese patent laid-open No. HEI 3-212896.

It is to be understood that while the foregoing illustrates the preferred embodiments and method of the present invention, other variations are possible. All such variations as would be obvious to one skilled in this art are intended to be included within the scope of the invention defined by the following claims.

What is claimed is:

1. An associative memory for storing a large amount of storage data and retrieving, when a retrieval data is inputted, the storage data corresponding to said retrieval data inputted, comprising:

a large number of memory words being divided into a plurality of memory blocks so as to respectively include at least one memory word group consisting of a plurality of memory words storing each storage data;

flag registers for storing match flags, each flag register corresponding to at least one of said large number of memory words, each match flag indicating, when storage data stored in the at least one of said large number of memory words and corresponding to said inputted retrieval data is detected on the occasion of retrieval, that said storage data corresponding to said inputted retrieval data is stored in the at least one of said large number of memory words corresponding to the each flag register; and bit line drive circuits for driving bit lines of a memory block for current retrieval, depending on condition of said match flags stored in said flag registers in a preceding retrieval operation.

2. An associative memory according to claim 1, wherein said bit line drive circuits drive bit lines of a memory block including one of said large number of memory words corresponding to one of said flag registers in which one of said match flags are stored.

3. An associative memory according to claim 2, wherein said bit line drive circuits also drive bit lines of the other memory blocks which are assumed to store said divided memory word group.

4. An associative memory according to claim 3, wherein the other memory blocks of which said bit lines are driven are adjacent to said memory block corresponding to said flag register in which match flag is stored.

5. An associative memory according to claim 2, wherein said bit line drive circuits drive bit lines of corresponding memory blocks, depending on condition of dividing said memory word group.

6. An associative memory according to claim 1, wherein bit lines of all memory blocks are driven at the time of first retrieval for said memory word group.

7. An associative memory according to claim 1, wherein only bit lines of predetermined memory blocks are driven at the time of first retrieval for said memory word group.

8. An associative memory according to claim 1, wherein said match flag is generated from an output of a circuit for giving priority to the memory blocks.

9. An associative memory according to claim 1, further comprising a plurality of continuous retrievals control circuit for executing current retrieval to said memory word group including memory word corresponding to said flag registers by receiving that said match flag is stored in said flag register on occasion of preceding retrieval.

* * * * *